United States Patent
Pai

(10) Patent No.: US 7,531,424 B1
(45) Date of Patent: May 12, 2009

(54) VACUUM WAFER-LEVEL PACKAGING FOR SOI-MEMS DEVICES

(75) Inventor: Minfan Pai, Los Altos, CA (US)

(73) Assignee: Discera, Inc., Ann Arbor, MI (US)

( * ) Notice: Subject to any disclaimer, the term of this patent is extended or adjusted under 35 U.S.C. 154(b) by 272 days.

(21) Appl. No.: 11/417,737

(22) Filed: May 3, 2006

Related U.S. Application Data

(60) Provisional application No. 60/677,237, filed on May 3, 2005.

(51) Int. Cl.
   *H01L 21/76* (2006.01)
(52) U.S. Cl. .......... 438/421; 438/296; 438/424
(58) Field of Classification Search ........... 438/296, 438/421, 424, 435, 437
   See application file for complete search history.

(56) References Cited

U.S. PATENT DOCUMENTS

| | | | | |
|---|---|---|---|---|
| 5,453,154 | A * | 9/1995 | Thomas et al. ............... | 216/18 |
| 6,245,638 | B1 * | 6/2001 | Gardner et al. .............. | 438/424 |
| 6,352,935 | B1 * | 3/2002 | Collins et al. ............... | 438/708 |
| 6,916,728 | B2 * | 7/2005 | Gogoi et al. ................ | 438/481 |
| 6,960,488 | B2 * | 11/2005 | Brosnihan et al. ............ | 438/52 |
| 6,972,448 | B2 * | 12/2005 | Houston ..................... | 257/270 |
| 7,187,060 | B2 * | 3/2007 | Usui ......................... | 257/659 |
| 7,312,505 | B2 * | 12/2007 | Kipnis et al. ................ | 257/415 |
| 2002/0096743 | A1 * | 7/2002 | Spooner et al. ............. | 257/620 |
| 2005/0139542 | A1 * | 6/2005 | Dickensheets et al. ...... | 210/490 |
| 2006/0220223 | A1 * | 10/2006 | Lu et al. ................... | 257/704 |

OTHER PUBLICATIONS

Brosnihan et al., "Embedded Interconnect and Electrical Isolation for High-Aspect-Ratio, SOI Inertial Instruments," International Conference on Solid-State Sensors and Actuators, pp. 637-640 (1997).

* cited by examiner

*Primary Examiner*—Phuc T Dang
(74) *Attorney, Agent, or Firm*—Lempia Braidwood LLC

(57) ABSTRACT

A device and method for fabricating the device is disclosed. The device includes a substrate having an active layer disposed on a sacrificial layer. A trench is formed in the active layer to electrically isolate first and second regions in the active layer, and a non-conductive material is deposited on the substrate such that the non-conductive material fills the trench to form a substantially planar surface for support of further components of the device. In some cases, the non-conductive material fills only a portion of the trench sufficient to form the substantially planar surface. The non-conductive material may include silicon nitride.

11 Claims, 4 Drawing Sheets

VACUUM WAFER-LEVEL PACKAGING FOR SOI-MEMS DEVICES

CROSS-REFERENCE TO RELATED APPLICATION

This application claims the benefit of U.S. provisional application Ser. No. 60/677,237, filed May 3, 2005, and entitled "Method for Vacuum Wafer-Level Packaging of SOI-MEMS," the entire disclosure of which is hereby expressly incorporated by reference.

BACKGROUND OF THE DISCLOSURE

1. Field of the Disclosure

The disclosure relates generally to microelectromechanical systems (MEMS) and, more particularly, to wafer-level packaging of MEMS devices.

2. Brief Description of Related Technology

Wafer-level encapsulation has become an important packaging method, particularly for microelectromechanical systems (MEMS) and other microsystem or nanoscale devices (collectively referred to herein as "MEMS devices"). MEMS devices are susceptible to damage from contact or exposure to dust, etc. Wafer-level encapsulation provides a convenient means for protecting these devices and thereby enabling them to be handled like conventional IC chips.

With reference to FIGS. 1A and 1B, wafer-level encapsulation is a process in which a device substrate wafer 102 having tens to hundreds of device die is joined to a matching cap wafer (a port of which is shown as element 106), which contains a corresponding number of cavities. After the wafers are joined, each device 104 resides within an "encapsulation region" formed by cap wafer material and the substrate on which the device resides, as shown in FIG. 1. Once sealed, conventional techniques, such as wafer dicing, may be used to separate the individual sealed die from the joined wafers. In many applications, the operational characteristics and behavior of the MEMS device is improved by operation in a low-pressure or high-pressure environment. For these applications, it is vital that the seal between the device wafer and cap wafer is of high-integrity (i.e., exhibits little or no gas leakage).

Silicon-on-insulator (SOI) wafers have been widely used to fabricate a variety of MEMS devices, which are often thereby referred to as "SOI-MEMS" devices. SOI wafers have an active (or working) layer of silicon disposed on a layer of silicon dioxide, which, in turn, is disposed on a silicon handle wafer. To form SOI-MEMS devices, deep reactive-ion-etching (deep-RIE) is used to "cookie-cut" through the active layer to define the device structure, electrodes, and interconnection lines. Multiple electrically-isolated regions within a device die are formed by etching isolation trenches around each region. The isolation trenches extend through the entire thickness of the active layer.

As shown in FIG. 1B, external electrical connection to each electrical (or device) region 108 is often made via wire bond pads 114 which are located outside the bounds of the encapsulation region of the die (as defined by bonding ring 116). This leads to one of two problems: (1) the isolation trenches 110 that define the wire bond pads 114 and interconnect lines 112 pass through the bonding region where the cap wafer material and device substrate are joined, as shown in FIG. 1B, thereby forming leakage paths through which gasses and other fluids can pass; and, (2) electrical interconnect lines must cross the trench region. Therefore, either the hermetic or pressurized environment of the sealed unit is compromised, or it is difficult to form reliable electrical connection to regions within the encapsulation region.

SUMMARY OF THE DISCLOSURE

In accordance with one aspect of the disclosure, a method is useful for fabricating a device on a substrate having an active layer disposed on a sacrificial layer. The method includes forming a trench in the active layer to electrically isolate first and second regions in the active layer, and depositing a non-conductive material on the substrate such that the non-conductive material fills the trench to form a substantially planar surface for support of further components of the device.

In some cases, the depositing step only fills a portion of the trench sufficient to form the substantially planar surface.

The non-conductive material may include silicon nitride. Alternatively or additionally, the non-conductive material includes low-stress silicon nitride.

Some embodiments may further include the step of forming a conductive interconnect line crosses over the filled trench to provide an electrical connection between the first and second regions of the active layer. The method may then include the step of forming an insulator disposed on the interconnect line to accommodate a bonding encapsulation material. The method mat may still further include the steps of forming and releasing a device structure in the active layer by removing the sacrificial layer in one of the first and second regions.

In accordance with another aspect of the disclosure, a method of fabricating a device on a substrate having an active layer disposed on a sacrificial layer includes forming a trench in the active layer to electrically isolate first and second regions in the active layer, depositing a non-conductive material on the substrate such that the non-conductive material sufficiently fills the trench, and forming a conductive interconnect line that crosses over the trench. The non-conductive material sufficiently fills the trench to structurally support the conductive interconnect line across the trench.

In accordance with yet another aspect of the disclosure, a device includes a substrate comprising an active layer disposed on a sacrificial layer, first and second regions of the active layer separated by a trench, a non-conductive material disposed in the trench such that the non-conductive material sufficiently fills the trench to form a substantially planar surface over the trench, and a conductive line disposed across the trench and supported by the substantially planar surface of the non-conductive material.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 1A:
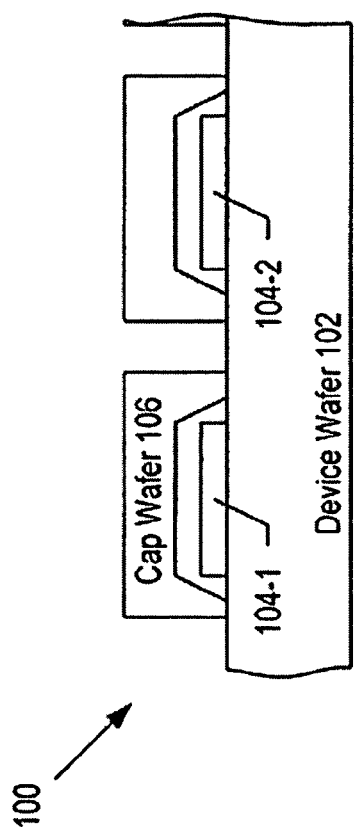
FIG. 1A is a schematic, cross-sectional view of a conventional wafer-level encapsulated MEMS die.
Figure 1B:
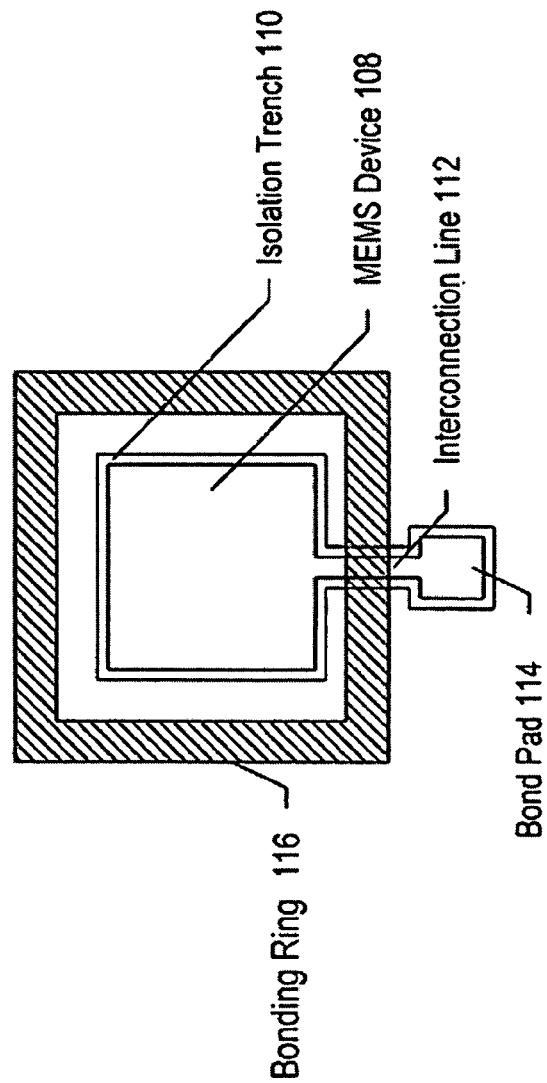
FIG. 1B is a schematic, plan view of a conventional wafer-level encapsulated SOI-MEMS die.

While the disclosed devices and methods are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

The invention generally relates to SOI-MEMS structures and devices, and the fabrication thereof. As described herein, the disclosed structures, devices and methods support the wafer-level encapsulation and vacuum packaging of SOI-MEMS devices. Generally speaking, the structures and devices disclosed herein include an isolation trench that electrically isolates device components from the surrounding substrate. Interconnect lines are then fabricated across or over the trench to allow or provide electrical access connections from outside the encapsulated region (e.g., cap wafer) to the device region.

The disclosed structures, devices and methods are well suited for use with a variety of encapsulation and packaging techniques. The exemplary embodiments described below are set forth with the understanding that the SOI-MEMS devices are not limited to any specific type of packaging substrate, wafer or cap, or any bonding mechanism, such as glass frit.

In any case, the structures, devices and methods described herein generally support the electrical connections that permeate the vacuum packaging interface of SOI-MEMS devices without the problems of prior, or conventional, designs, such as leak paths.

Figure 2:
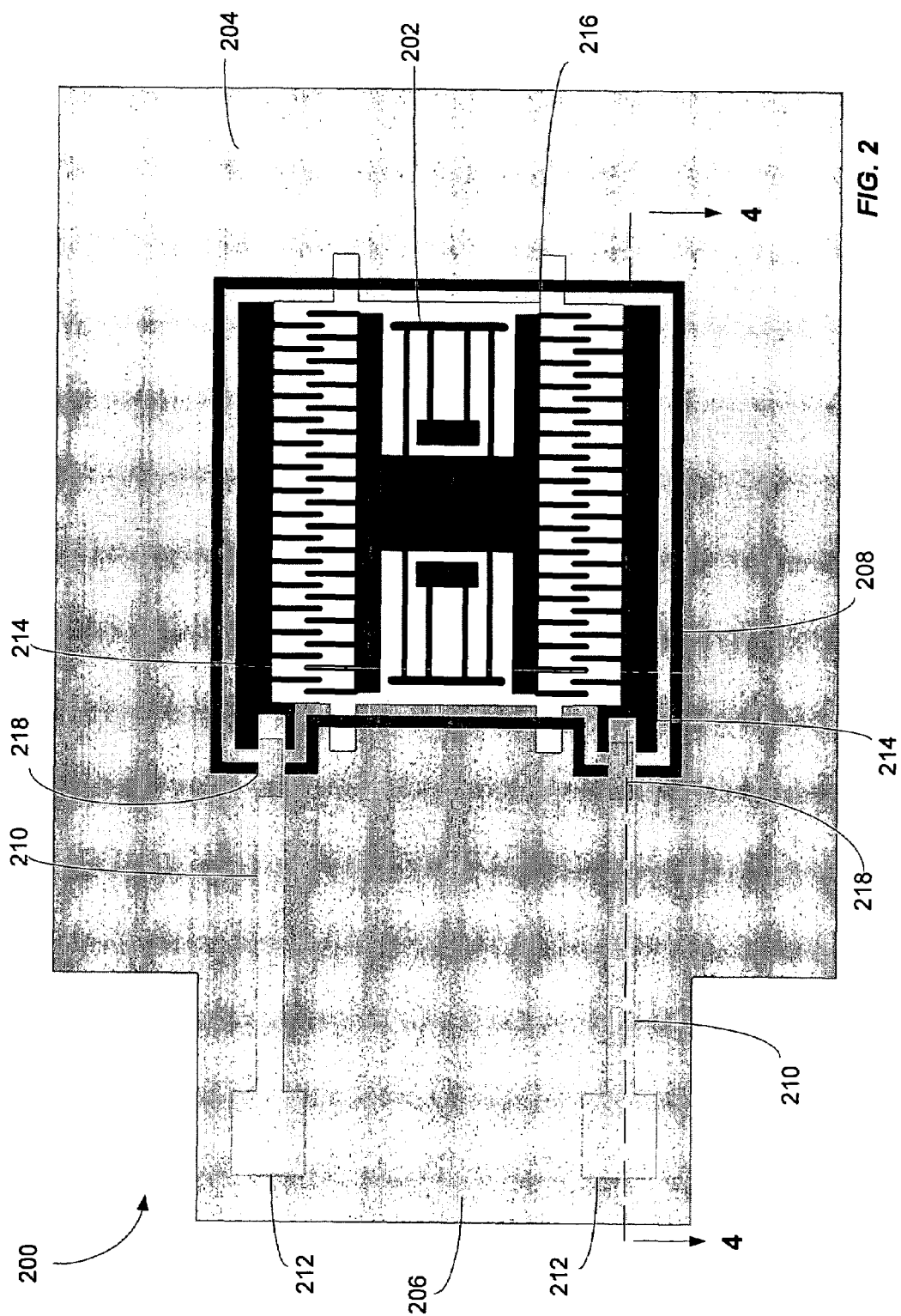
FIG. 2 is a schematic, plan view of an exemplary SOI-MEMS device having interconnect lines in accordance with one aspect of the disclosure.

Turning now to the drawing figures, FIG. 2 depicts an exemplary SOI-MEMS device indicated generally at 200 prior to encapsulation for ease in illustration. The device 200 includes a device region 202, a field region 204, and a bond pad (or other circuit) region 206. The device region 202 is generally electrically isolated from the regions 204 and 206 by a trench 208 that encircles the active structures and components of the device 200, as shown. In this exemplary case, two electrical connections are made between the bond pad region 206 and the device 200 via interconnect lines 210 running from bond pads 212 to electrodes 214 of the device 200. The electrodes 214 may correspond with anchored, or non-suspended structures of the device 200 configured to interact electrostatically or otherwise with suspended structure(s) 216. In this exemplary case, such interaction may form a resonant structure that vibrates in accordance with a drive signal provided via the interconnect lines(s) 210.

Each interconnect line 210 includes a portion 218 disposed across or over the trench 208. As described below, the interconnect portion 218 is deposited on a dielectric layer disposed in the trench 208. The dielectric layer generally supports the interconnect portion 218 by providing a substantially flat or planar support surface for crossing the trench 208, while maintaining the electrical isolation established by the trench 208. The dielectric layer may also, but need not, completely fill the trench 218. In some cases, voids may be acceptable when, for instance, the trench 218 is disposed entirely within the bonding area (which would be the case in the exemplary embodiment shown in FIG. 2). For example, in one exemplary case, a low-stress nitride layer deposited as the dielectric had a thickness of about 0.9 microns, and filled the top 1.75 microns of the trench 218. The trench width may be kept as narrow as appropriate to minimize the thickness of the dielectric layer required for filling.

Figure 3:
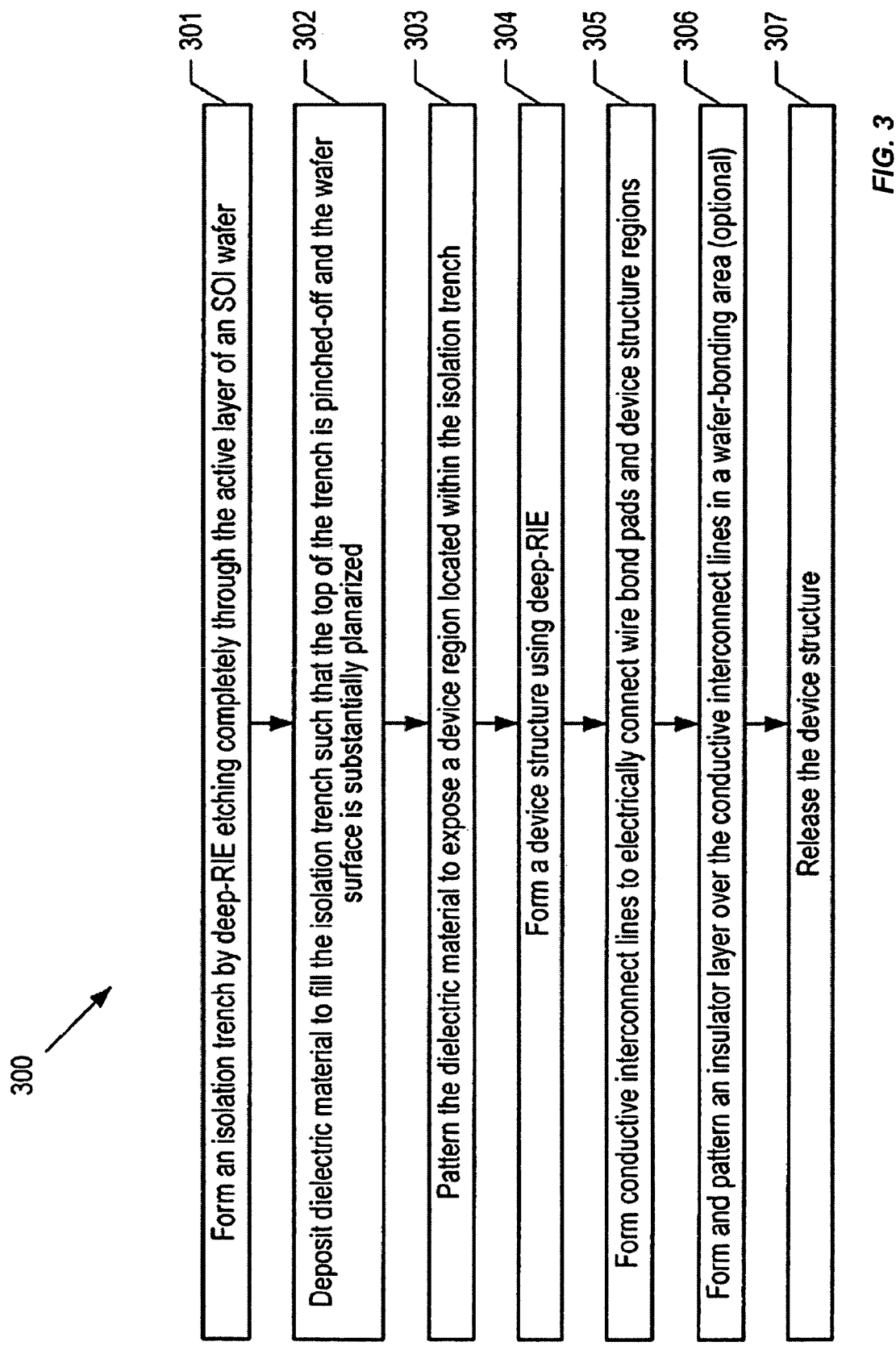
FIG. 3 is a flow diagram of exemplary fabrication steps taken to form the SOI-MEMS device of FIG. 2 in accordance with another aspect of the disclosure; and, FIGS. 4A-4C are schematic, cross-sectional views of the SOI-MEMS device taken along lines 4-4 of FIG. 2 during various stages of fabrication.

FIG. 3 depicts fabrication steps that of an exemplary method 300 for forming an SOI-MEMS device which is suitable for subsequent wafer-level bonding. The fabrications method 300 generally begins with the formation of an isolation trench, which provides electrical isolation of the device area from the surrounding material of the active layer of an SOI wafer. The method 300 continues with a "trench-filling" fabrication step, in which a layer of dielectric material, such as silicon nitride or silicon dioxide (or any combination thereof) is deposited and fills the isolation trench. At the end of the trench-filling fabrication step, the surface of the wafer is essentially planar or substantially flat, and is then suitable for further processing fabrication steps such as photolithography, etches, or depositions. In addition, the filled trench provides mechanical support for subsequently-deposited films such as metal or other conductive interconnect lines. The planar or flat nature of the surface (or mechanical support) formed over the isolation trench is also useful for, among other things, avoiding breaks and other failures in the electrical connections.

Figure 4A:
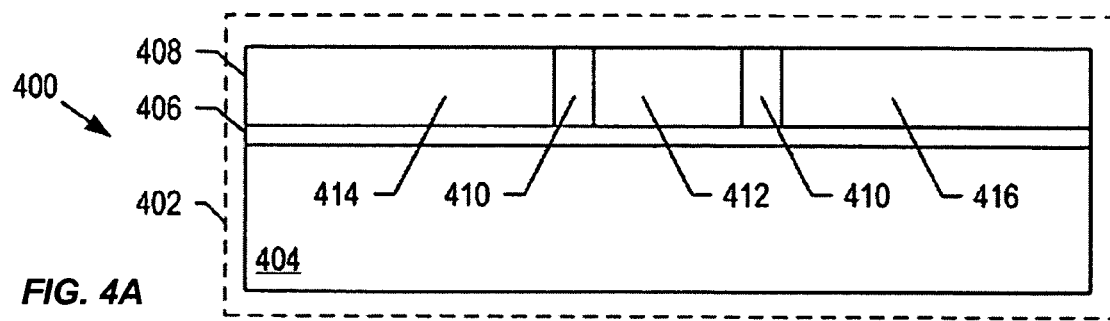
Figure 4B:
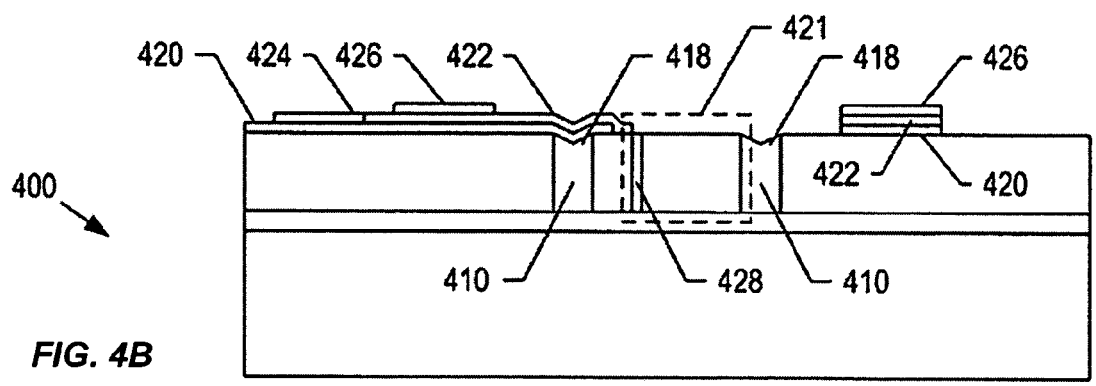
Figure 4C:
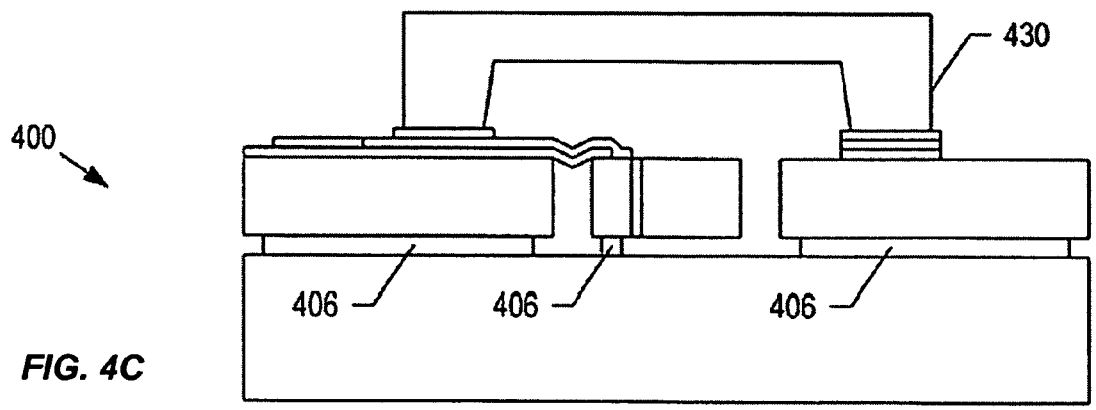

The fabrication steps of the method 300 shown in FIG. 3 are now described in conjunction with the corresponding exemplary structures formed thereby, as shown in FIGS. 4A through 4C, which depict side views of the salient components of an exemplary SOI-MEMS structure 400 at different stages of fabrication. The SOI-MEMS structure 400 generally corresponds with the exemplary structures and device shown in FIG. 2, as shown via cross-section taken along lines 4-4, although structure sizes and scales have been adjusted for ease in illustration.

Fabrication step 301 describes the formation of an isolation trench 410. The isolation trench 410 is formed by etching completely through an active (or working) layer 408, which is disposed on an oxide or other sacrificial layer 406, which is disposed on a handle wafer 404 (which together compose an SOI substrate 402). The isolation trench 410 provides electrical isolation of a device region 412 from a wire bond region 414 and a field region 416, as depicted in FIG. 4A.

Fabrication step 302 includes the filling of the trench 410 with one or more dielectric materials, such as a first dielectric material 418. In some embodiments, a second dielectric material 420 is deposited over the first dielectric material 418 such that, during subsequent processing, one of either the first or second dielectric material can be removed without removal of the other. In the exemplary embodiment depicted in FIGS. 4A through 4C, the first dielectric material 418 may be high-pressure silicon dioxide and the second dielectric material 420 may be stoichiometric silicon nitride.

Methods, techniques and materials suitable for fabrication step 302 include (i) conformal deposition of a dielectric material such as silicon nitride, silicon-rich silicon nitride, or oxides of silicon using low-pressure chemical vapor deposition (LPCVD), (ii) liquid deposition of spin-on glass, photoresist, or polyamide, and (iii) plasma-enhanced chemical vapor deposition (PECVD) of dielectric materials such as silicon monoxide, silicon dioxide, silicon oxynitride, or silicon nitride. It should be noted that some of these deposition methods result in the dielectric being deposited across the top surface of the substrate, as well as in the isolation trench. In any case, the dielectric layer can be said to have planarized the wafer surface, including at the trenches.

A subsequent mask-etch sequence may then be used to pattern the dielectric layer to, for instance, expose one or more regions for further processing, as described below. The fabrication step 302 may, but need not, include an RIE step to remove nitride from areas in the field or bond pad regions 414 and 416.

Fabrication step 303 includes the patterning of the dielectric material 420 to open a device region 421, as shown in FIG. 4B, which is suitable for formation of SOI-MEMS device in the device region 412. It should be noted that the patterning of the dielectric material 420 typically requires the use of photolithography (e.g., involving the above-noted mask). Conventional photolithography is difficult to perform on a wafer that has substantial topography on its surface, such as the substrate 402 after formation of the trench 410. Fabrication step 302, among other things, enables the use of conventional photolithography during processing fabrication steps performed subsequent to fabrication step 301.

In an exemplary case, fabrication step 303 includes deposition of an oxide layer of about 2.0 microns to serve as an etch mask for the subsequent silicon nitride wet processing step, which may involve BHF-based or other techniques known to those skilled in the art. The wet etch may, but need not, create a sloped oxide block profile for better subsequent metal step coverage.

In some cases, the oxide layer is deposited over an area wider, or larger, than the device area, to ensure comprehensive coverage of the trench. In this way, undesired etching through keyholes in the oxide is prevented.

Fabrication step 304 includes the formation of the SOI-MEMS device in the device region 421 using, for example, deep-RIE. This fabrication step may involve, for example, the formation of a compliant spring 428, as shown in FIG. 4B. It will be clear to those skilled in the art how to form a variety of structures and components of SOI-MEMS devices using deep-RIE.

In some embodiments, fabrication step 304 is used to form a contiguous structure that comprises an SOI-MEMS device, at least one interconnect line, and a region on which a wire bond pad is subsequently formed. In some of these embodiments, the isolation trench 410 crosses the bonding region 426, creating a potential gas leakage path. In these embodiments, the first dielectric material 418 and/or the second dielectric material 420 may provide material that serves to complete the environmental seal formed when the substrate 402 is bonded to the cap wafer 430.

Fabrication step 305 includes the formation of a wire bond pad 424 and a conductive (e.g., metal) line 422, which provides interconnection between the wire bond pad 424 and the device region 421. The conductive line 422 may include, for example, aluminum, gold, polysilicon, or any other conductive material (e.g., Ti, Pt) either alone or in combination with other such materials for any desired purpose (e.g., reliability, adhesion, etc.). In one exemplary case, aluminum (2 wt. % Si) was sputtered to form a layer of approximately 0.8 microns.

In some cases, fabrication steps 304 and 305 may be re-ordered such that the metal evaporation and lift off steps occur before device formation.

Although one single etching step can be used to construct both the isolation trench and the device at the same time, a two-step DRIE approach eliminates the possibility of wafer processing on non-planar surfaces with deep etched holes and trenches, which may be advantageous in, for example, manufacturing in foundry environments. After the release step, the metal line may be either suspended over the isolation trench or fully supported mechanically, depending on the dielectric materials implemented and whether they are etched away during the release process. If aluminum is selected to fabricate the interconnection lines (deposited before device release), structural release can be done by vapor HF, as vapor HF does not etch aluminum as does liquid HF.

Optional fabrication step 306 includes the formation and patterning of an insulator or passivation layer 426 over the conductive metal line 422. The insulator layer 426 provides protection for the metal line 422 in cases where the wafer bond process used to join the substrate 402 and the cap wafer 430 uses conductive material that would otherwise cause an electrical short between the metal line 422 and other metal lines or electrically-isolated regions via the bond material. Examples of such wafer bond processes include eutectic bonding, thermo-compression bonding, and solder bonding. In some cases, such embodiments may utilize intermediate conductive layers (e.g., silicon) rather than metal lines for the interconnects. Consequently, metal may be patterned only on top of the bond pads.

Fabrication step 307 includes the release of the device structure. Most SOI-MEMS devices require a release fabrication step to remove the material of the sacrificial layer 406 which resides under the device structure, thereby making one or more components or structures of the SOI-MEMS devices movable. The choice of release method used is dependent upon the materials that compose the metal line 422 as well as other dielectrics present in the SOI-MEMS device 400. In some cases, fabrication step 307 may include or involve an HF release. Other release techniques may be used, as known to those skilled in the art.

In embodiments utilizing silicon nitride as a trench fill material, low-stress silicon nitride may be used in the interest of substantially (if not completely) filling the trench with a minimum deposition layer thickness, while forming and maintaining a substantially flat surface for the interconnect line, as described above. For example, the dielectric layer thickness may be approximately 1 micron, but nevertheless fill a trench having a depth of approximately 30 microns and a width (or diameter) of approximately 2 microns. To fill such trenches, some low-stress silicon nitrides suitable for use with the disclosed methods and devices may exhibit stress levels under about 100 MPa. Furthermore, commercially available low-stress silicon nitrides may exhibit such low stresses to avoid any wafer warping due to stresses. As the deposition layer thickness decreases, such stresses would otherwise become more common. Such low-stress silicon nitride materials may be silicon rich through, for example, the introduction of silane, and other characteristics of various silicon nitride recipes known to those skilled in the art.

Notwithstanding the foregoing description of suitable silicon nitride-based trench fills, other dielectrics may be used that can fill the trench to an extent sufficient to form a substantially flat or planar top surface as shown and described above. In some cases, the trench fill material may also benefit from being capable of surviving the etchant involved in the above-described device release step. More generally, however, the other dielectrics suitable for use avoid generating stresses at the layer thickness involved that would otherwise cause manufacturing complications in packaging, dicing, and other handling or processing due to the warping of the wafers, etc.

The disclosed fabrication methods and device structures are well suited for the fabrication of a variety of MEMS devices, including, for example, MEMS resonators, accelerometers, and gyroscopes.

The fabrication method described may be useful in implementing wafer bonding that uses intermediate layers, such as glass frit, where a perfectly planar bonding surface is not required.

While the disclosed methods, structures and devices have been described above in connection with SOI devices, practice of the disclosed invention is not limited to any particular bulk wafer material or composition, sacrificial layer material or composition, or active layer material or composition. Other characteristics, such as thickness, doping, etc. of the active and sacrificial layers may vary as well, as desired. Furthermore, practice of the disclosed invention is not limited to any particular starting materials. That is, the manner in which the active layer is formed is not germane to practice of the invention, such that the SOI or other substrate layers or structures may be grown and deposited as desired. In such cases, starting with a bulk wafer may lead to flexibility in designs, such as polysilicon or other complex active layers.

In some instances, well-known structures, materials, or operations are not shown or described in detail to avoid obscuring aspects of the illustrative embodiments. It is understood that the various embodiments shown in the drawing figures are illustrative, and are not necessarily drawn to scale.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A method of fabricating a device, the method comprising the steps of:
   forming a trench in an active layer of a silicon-on-insulator substrate having a sacrificial layer on which the active layer is disposed, the trench being configured to electrically isolate first and second regions of the active layer;
   depositing a non-conductive material on the substrate such that the non-conductive material fills the trench to form a substantially planar support surface above the trench and the first and second regions of the active layer;
   forming a MEMS device structure from the active layer in the first region;
   forming a conductive interconnect line that crosses over the trench via the substantially planar support surface for an electrical connection with the MEMS device structure; and
   bonding a cap wafer to the silicon-on-insulator substrate in a bonding area through which the conductive interconnect line passes, the bonding step forming an encapsulation region in which the MEMS device structure and the trench are entirely disposed.

2. The method of claim 1, wherein the depositing step fills a portion of the trench sufficient to form the substantially planar surface.

3. The method of claim 1, wherein the non-conductive material comprises silicon nitride.

4. The method of claim 1, wherein the non-conductive material comprises low-stress silicon nitride.

5. The method of claim 1, further comprising the step of forming an insulator disposed on the interconnect line to accommodate a bonding encapsulation material.

6. The method of claim 1, further comprising the step of forming a wire bond pad disposed on the second region of the active layer and connected to the respective device structure via the conductive interconnect line such that the wire bond pad is disposed outside of the encapsulation region.

7. A method of fabricating a device, the method comprising the steps of:
   forming a trench in an active layer of a silicon-on-insulator substrate having a sacrificial layer on which the active layer is disposed, the trench being configured to electrically isolate first and second regions of the active layer;
   depositing a non-conductive material on the substrate such that the non-conductive material sufficiently fills the trench;
   forming a MEMS device structure from the active layer in the first region;
   forming a conductive interconnect line that crosses over the trench for an electrical connection with the MEMS device structure; and
   bonding a cap wafer to the silicon-on-insulator substrate in a bonding area through which the conductive interconnect line passes, the bonding step forming an encapsulation region in which the MEMS device structure and the trench are entirely disposed;
   wherein the non-conductive material sufficiently fills the trench to structurally support the conductive interconnect line across the trench.

8. The method of claim 7, wherein the depositing step fills a portion of the trench sufficient to form a substantially planar surface.

9. The method of claim 7, wherein the non-conductive material comprises silicon nitride.

10. The method of claim 7, wherein the non-conductive material comprises low-stress silicon nitride.

11. The method of claim 7, further comprising the step of forming a wire bond pad disposed on the second region of the active layer and connected to the respective device structure via the conductive interconnect line such that the wire bond pad is disposed outside of the encapsulation region.

* * * * *